Aug. 11, 1970 P. J. HEIDENREICH 3,523,838

VARIABLE CAPACITANCE DIODE

Filed May 9, 1967

INVENTOR.
Paul J. Heidenreich

BY Mueller, Aichele & Rauner

ATTY'S.

United States Patent Office 3,523,838
Patented Aug. 11, 1970

3,523,838
VARIABLE CAPACITANCE DIODE
Paul J. Heidenreich, Mesa, Ariz., assignor to Motorola, Inc., Franklin Park, Ill., a corporation of Illinois
Filed May 9, 1967, Ser. No. 637,159
Int. Cl. H01l 7/00, 7/36
U.S. Cl. 148—175 4 Claims

ABSTRACT OF THE DISCLOSURE

A semiconductor diode is fabricated by a process involving the formation of a diffused step junction in an epitaxial layer having a carefully retrograded impurity profile. The resistivity-thickness profile of the epitaxial layer is a critical feature of the device and of the method for its fabrication. Designed for use as a voltage-variable capacitor in tunable circuits, a specific embodiment of the diode has the following electrical characteristics:

Junction capacitance range: 6.8 to 100 pf.
Minimum tuning ratio: 2.7 to 1
Reverse breakdown voltage: 30 v.
Minimum Q at 50 mHz.; 4 v.: 500

BACKGROUND

This invention relates to the fabrication of a semiconductor diode to be used as a voltage-variable capacitor. A method is provided for producing an epitaxial, passivated variable capacitance diode having an ultra-high capacitance ratio and a Q value of 500 or more at 2 volts and one megacycle.

In general, a semiconductor diode is a two-terminal p-n junction to be operated in the forward conduction region as a rectifier, or in the reverse avalanche region as a Zener diode. A variable capacitance diode, however, operates neither as a rectifier nor as an avalanche device. Instead, it operates principally in the region between forward conduction and reverse breakdown. Therefore, the term "diode" may actually be considered a misnomer, but such use of the term is well established.

A tuning diode is a variable capacitance device to be used as a means of frequency selection in a tuning circuit such as found in a common radio receiver. The desirable characteristics of a tuning diode are a wide capacitance range, a high capacitance ratio, and a high Q value where:

$$Q=1/2\pi fCR_S$$
$f$=frequency
$C$=capacitance and $R_S$=series resistance

Variable capacitance diodes comprising a step junction formed in a doped epitaxial layer by the diffusion of an impurity of opposite conductivity type therein have been available previously. However, the electrical characteristics of such prior devices have not been entirely suitable for use in tuning circuits.

THE INVENTION

It is an object of the invention to provide a semiconductor tuning diode having improved electrical characteristics. More particularly, it is an object of the invention to provide an improved epitaxial passivated variable capacitance tuning diode having an ultra high capacitance ratio and a high Q value. It is a further object of the invention to provide an improved process for the fabrication of such a device.

A primary feature of the invention involves the growth of a doped epitaxial layer having a carefully retrograded impurity profile. That is, the initial growth of epitaxial semiconductor material is lightly doped to provide a resistivity as high as 10 ohm-centimeters, for example, with each succeeding increment of epitaxial growth being more heavily doped to provide the heaviest doping in the vicinity of the p-n junction, where the resistivity is 0.1 ohm-centimeter or less.

The invention is embodied in a process for the fabrication of a semiconductor diode comprising the steps of epitaxially growing a doped semiconductor layer on a low resistivity substrate, increasing the impurity content of the epitaxial layer during successive stages of growth to provide a sharply decreasing resistivity gradient, then forming a shallow passivated p-n junction within a relatively heavily doped region of said epitaxial layer and completing the device with the usual ohmic contacts and packaging means.

The invention is further embodied in a semiconductor structure comprising a body of semiconductive material including therein contiguous zones of opposite conductivity type, one of said zones having a retrograded impurity profile characterized by at least a tenfold change in resistivity within 5 microns of the p-n junction formed by the contiguous zones of opposite conductivity type.

The following relationship is characteristic of a voltage-variable capacitance diode:

$$C=k/V^{\alpha}$$

where $C$=capacitance
$V$=reverse bias voltage
$k$=constant and $$-\alpha=d(\ln C)/d(\ln V)$$

which is a measure of the sensitivity of diode capacitance to changes in the reverse bias voltage.

It is desirable to be able to build a diode having a preselected $\alpha$ value, and to maximize the bias voltage range over which $\alpha$ remains constant. This is accomplished in accordance with a preferred embodiment of the present invention by providing an impurity profile in the epitaxial layer which corresponds to a resistivity gradient with respect to epitaxial layer thickness ($dp/dx$) equal to $1/\alpha-2$. For example, to build a diode having $\alpha=3$, a resistivity gradient of $-1.66$ ohm-centimeters per micron of epitaxial thickness is provided.

In accordance with a preferred embodiment of the invention, a low resistivity n-type monocrystalline silicon wafer is selected as a substrate for epitaxial growth. The wafer contains a uniform concentration of antimony sufficient to provide a resistivity from 0.008 to 0.015 ohm-centimeter. The crystallographic orientation is 2° off the (111) axis toward (110). The wafer is prepared for epitaxial growth by a series of steps involving a mechanical lapping and polishing, plus gas phase etching to provide a mirror surface.

Epitaxial silicon is then deposited on the polished wafer surface at 1000° C. with a growth rate of one-half micron per minute. The epitaxial layer is doped with arsine ($AsH_3$) during growth. The doping level is initially maintained at a concentration sufficient to provide a resistivity of about 10 ohm-centimeters, which corresponds to less than $10^{15}$ atoms per cc. The doping level is increased after each minute of epitaxial growth. Each successive increase in doping level is slightly greater than the previous increase, controlled to provide an ultimate impurity concentration of about $10^{18}$ atoms per cc.

Once the desired impurity profile is established, a final epitaxial layer if intrinsic silicon is deposited. The total epitaxial silicon thickness is about 5 microns, with the final intrinsic layer having a thickness of only about 4,000 angstroms. Immediately following the final epitaxial layer, silicon oxide is deposited at 900° C. to form a passivation layer at least 5,000 angstroms thick.

The passivated epitaxial wafer is then processed by well-known photoresist and selective etching techniques to open a window in the oxide layer for the purpose of forming a diffused anode region by passing a high concentration of boron dopant in contact with the epitaxial silicon at 1080° C. for a five-minute predeposition treatment, followed by about 15 minutes drive to form a p-n junction at a depth of approximately 1 micron.

The boron diffusion inherently forms a layer of borosilicate glass approximately 500 angstroms thick which must be selectively etched to expose a limited area of the diffused region for the purpose of metallization. The wafer is metallized with successive layers of chromium, silver, and gold by conventional vacuum evaporation techniques. Photoresist procedures are again used to mask the ohmic pattern, followed by the removal of metal from the remaining areas of the wafer.

The surface is then waxed for protection while the back side of the wafer is etched with an aqueous HF—$HNO_3$ solution to thin the wafer to a thickness of 5 mils or less for the purpose of reducing series resistance. The back side is then prepared for metallization, which consists of the vacuum evaporation of antimony-doped gold to further reduce $R_s$.

DRAWINGS

Figure 3:
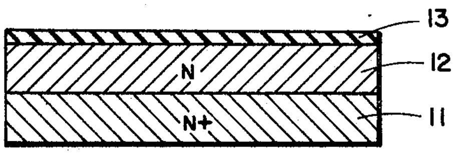
Figure 4:
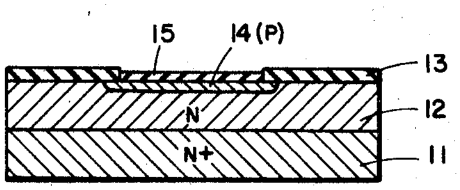
Figure 5:
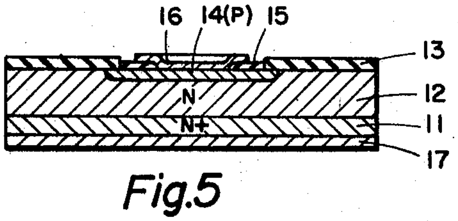

FIGS. 3, 4, and 5 are enlarged cross-sectional views illustrating various stages in the fabrication of the device of the invention.

Figure 1:
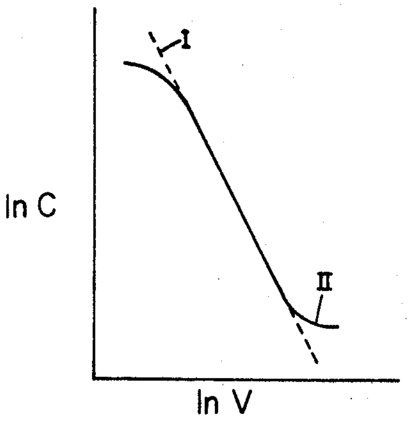
FIG. 1 is a plot showing the sensitivity of capacitance to changes in the bias voltage of the device of the invention.

In FIG. 1 the dotted line I shows a theoretically ideal relationship between capacitance and voltage for purposes of the present invention. A device with a ln $C$/ln $V$ slope of 2 is ideal for wide-range frequency sweepers and other applications where it is advantageous to provide a change in frequency that is directly proportional to a change in the bias voltage. Curve II shows the departure from an ideal relationship, due to the effect of contact potentials, substrate out-diffusion, and imperfect junction formation.

Figure 2:
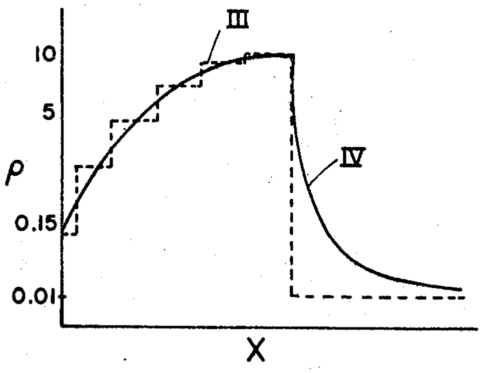
FIG. 2 is a plot showing the resistivity profile of the device of the invention.

In FIG. 2 curve III shows the impurity profile required in a tuning diode to produce a voltage-capacitance relationship as illustrated in FIG. 1. A stair-stepped doping schedule during epitaxial growth that corresponds to curve IV is adequate to provide the smooth resistivity profile of curve III, because of an inherent redistribution of impurities during epitaxial growth and subsequent high temperature processing.

FIG. 3 illustrates a passivated epitaxial semiconductor wafer prepared as an intermediate step in the fabrication of the tuning diode of the invention. Substrate 11 is preferably a low resistivity monocrystalline silicon wafer. Other low resistivity substrates may be substituted for the silicon, provided only that the material be suitable as a base for the growth of epitaxial semiconductor layer 12.

The surface of substrate 11 is prepared for epitaxial semiconductor growth in accordance with known procedures, which typically include mechanical polishing and gas phase etching with HCl. The growth of epitaxial layer 12, preferably silicon, is initiated with simultaneous doping to provide a resistivity of at least about 5 ohm-centimeters, and preferably about 10 ohm-centimeters. In the case of silicon, when doping with a donor impurity such as phosphorus or arsenic, a resistivity of 10-ohm-centimeters is provided by an impurity concentration of about $5\times10^{14}$.

Preferred conditions include a growth temperature of 1000° C. and a growth rate of one-half micron per minute.

A temperature within the range of 950° C. to 1050° C. is suitable, and a growth rate within the range of 0.3 to 0.6 micron per minute may be used. A suitable impurity concentration for initial growth lies within the range of intrinsic semiconductor material, up to a concentration of $10^{15}$ atoms per cc. in the case of silicon, with corresponding values being suitable for other semiconductor materials, to provide a resistivity within the range of intrinsic semiconductor up to an amount corresponding to a resistivity of no less than about 5 ohm-centimeters.

The total thickness of layer 12 should not exceed 8 microns and may be as thin as 3.5 microns, with 4 to 6 microns being preferred. The doping level in layer 12 is increased during successive stages of growth to provide a step-wise or continuous gradient of resistivity such that a resistivity of 0.05 to 0.3 ohm-centimeter is provided in the vicinity of the p-n junction to be formed during subsequent processing, described below. Preferably, the resistivity at or near the junction is from 0.1 to 0.2 ohm-centimeter.

Optionally, the final layer of epitaxial silicon material may be intrinsic, or nearly so, as a means of minimizing surface effects. Passivating dielectric layer 13 is then deposited on layer 12. Preferably, this layer is silicon dioxide which may be deposited by any of various procedures known to the art. It is essential that the deposition of oxide be carried out at a temperature no greater than 1100° C., and preferably no greater than 900° C., in order to minimize the redistribution of impurities within layer 12.

As shown in FIG. 4, a shallow diffused p-n junction 14 is formed within layer 12 by known procedures, including a selective etching of layer 13 to provide window 15 exposing the desired area of layer 12.

Preferably, the diffusion conditions include a high concentration of acceptor impurities, such as boron, to provide an impurity concentration within zone 16 at or near the solubility limit. Using boron tribromide at 1080° C. generally requires a five-minute predeposition period, followed by approximately 15 minutes drive-in. Other impurities may be used, as well as other boron compounds provided that substantially greater temperatures or diffusion times should not be used, in order to minimize the possible redistribution of the impurity profile. Junction 14 preferably lies at a depth of 1 micron, but this can be varied depending primarily on the thickness of layer 12 and the thickness of any final layer of intrinsic semiconductor as may be used to minimize surface effects. That is to say, junction 14 must lie within a heavily doped region of layer 12. Stated otherwise, diffused zone 16 must penetrate any such intrinsic semiconductor layer.

In connection with normal vapor phase diffusion procedures, a glass layer 17 is formed on the surface, at least a portion of which must be removed in order to permit ohmic contact with region 16.

As shown in FIG. 5, ohmic contact with regions 16 and 11 is made by metallization layers 18 and 19, respectively. Although ohmic pattern 18 may be formed by any of various conventional procedures using aluminum, molybdenum, or other metals, the preferred combination is to metallize with successive layers of chromium, silver, and gold by vacuum evaporation techniques.

Substrate layer 11 is preferably reduced in thickness for the purpose of minimizing series resistance, prior to deposition of metallic layer 19. Substrate 11 may be thinned by mechanical means or by chemical etching with a solution of hydrofluoric acid and nitric acid, as known in the art. Preferably, metallization 19 consists of antimony-doped gold. The wafer is then alloyed on a standard strip heater and ultimately packaged in any suitable assembly, for example, the DO–7 or DO–14 types.

I claim:

1. A method for fabricating a semiconductor structure which comprises the steps of epitaxially growing a doped semiconductor layer on a low resistivity substrate, increasing the impurity content of the epitaxial layer during successive stages of growth to provide a sharply decreasing resistivity gradient, coating the epitaxial layer with a passivating dielectric material, selectively etching a window in said dielectric layer, diffusing a conductivity-type determining impurity into the region of said epitaxial layer exposed by said window to form a shallow p-n junction, and forming an ohmic contact with the diffused region of said epitaxial layer and with said substrate, respectively.

2. A method as defined by claim 1 wherein said epitaxial growth is carried out at 950° C. to 1050° C.

3. A method as defined by claim 1 wherein the rate of epitaxial growth is from 0.3 to 0.6 micron per minute.

4. A method as defined by claim 1 wherein the epitaxial layer is doped to provide a resistivity gradient of ($1/\alpha-2$) ohm-centimeters per micron.

References Cited

UNITED STATES PATENTS

| | | | |
|---|---|---|---|
| 3,411,053 | 11/1968 | Wiesner | 317—234 X |
| 3,434,893 | 3/1969 | Josephs et al. | 148—187 |

OTHER REFERENCES

Nakanuma, S., Silicon Variable Capacitance Diodes with High Voltage Sensitivity by Low Temperature Epitaxial Growth. In IEEE Trans. on Elect. Devices. Vol. ed. 13, No. 7, pp. 578—589. July 1966.

L. DEWAYNE RUTLEDGE, Primary Examiner

R. A. LESTER, Assistant Examiner

U.S. Cl. X.R.

148—186